(12) United States Patent
Pesek et al.

(10) Patent No.: US 10,125,205 B2
(45) Date of Patent: Nov. 13, 2018

(54) CROSS-LINKABLE ACID COPOLYMER COMPOSITION AND ITS USE IN GLASS LAMINATES

(71) Applicant: E. I. DU PONT DE NEMOURS AND COMPANY, Wilmington, DE (US)

(72) Inventors: Steven C. Pesek, Orange, TX (US); Charles Anthony Smith, Vienna, WV (US)

(73) Assignee: E. I. DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/652,361

(22) PCT Filed: Dec. 19, 2013

(86) PCT No.: PCT/US2013/076333
§ 371 (c)(1),
(2) Date: Jun. 15, 2015

(87) PCT Pub. No.: WO2014/100309
PCT Pub. Date: Jun. 26, 2014

(65) Prior Publication Data
US 2015/0343745 A1 Dec. 3, 2015

Related U.S. Application Data

(60) Provisional application No. 61/739,562, filed on Dec. 19, 2012, provisional application No. 61/739,572, filed on Dec. 19, 2012, provisional application No. 61/739,557, filed on Dec. 19, 2012.

(51) Int. Cl.

| | |
|---|---|
| B32B 17/10 | (2006.01) |
| C08F 222/02 | (2006.01) |
| A63B 37/00 | (2006.01) |
| C08J 5/18 | (2006.01) |
| C09D 123/08 | (2006.01) |
| H01L 51/44 | (2006.01) |

(52) U.S. Cl.
CPC ........ *C08F 222/02* (2013.01); *A63B 37/0003* (2013.01); *B32B 17/10018* (2013.01); *B32B 17/10036* (2013.01); *B32B 17/10697* (2013.01); *B32B 17/10743* (2013.01); *C08J 5/18* (2013.01); *C09D 123/0869* (2013.01); *C09D 123/0876* (2013.01); *H01L 51/448* (2013.01); *B32B 2307/558* (2013.01); *C08J 2323/08* (2013.01); *C08J 2333/02* (2013.01); *C08L 2203/204* (2013.01); *C08L 2312/00* (2013.01); *Y02E 10/549* (2013.01); *Y10T 428/31507* (2015.04); *Y10T 428/31576* (2015.04); *Y10T 428/31649* (2015.04); *Y10T 428/31663* (2015.04); *Y10T 428/31699* (2015.04); *Y10T 428/31757* (2015.04); *Y10T 428/31797* (2015.04); *Y10T 428/31913* (2015.04); *Y10T 428/31935* (2015.04)

(58) Field of Classification Search
CPC ........ B32B 17/10743; B32B 17/10018; B32B 17/10036; B32B 17/10697
See application file for complete search history.

(56) References Cited

U.S. PATENT DOCUMENTS

| | | | |
|---|---|---|---|
| 2,632,921 A | 3/1953 | Kreidl et al. | |
| 2,648,097 A | 8/1953 | Kritchever | |
| 2,683,894 A | 7/1954 | Kritchever | |
| 2,704,382 A | 3/1955 | Kreidl | |
| 3,234,062 A | 2/1966 | Morris | |
| 3,311,517 A | 3/1967 | Keslar et al. | |
| 3,344,014 A | 9/1967 | Rees | |
| 3,361,702 A * | 1/1968 | Wartman | C08K 5/06 524/377 |
| 3,404,134 A | 10/1968 | Rees | |
| 3,762,988 A | 10/1973 | Clock et al. | |
| 3,852,136 A | 12/1974 | Plumat et al. | |
| 4,035,549 A | 7/1977 | Kennar | |
| 4,341,576 A | 7/1982 | Lewis | |
| 4,385,951 A | 5/1983 | Pressau | |
| 4,398,979 A | 8/1983 | Cathers et al. | |

(Continued)

FOREIGN PATENT DOCUMENTS

| | | |
|---|---|---|
| EP | 0769818 A2 | 4/1997 |
| WO | 91/01880 A1 | 2/1991 |

(Continued)

*Primary Examiner* — Karuna P Reddy (57) ABSTRACT

Provided herein are glass laminates, preferably safety glass laminates, that comprise a polymeric interlayer sheet formed of an acid copolymer composition. The acid copolymer composition comprises an ethylene acid copolymer which, in turn, comprises copolymerized units of ethylene, about 5 to about 90 wt % of copolymerized units of a first α,β-unsaturated carboxylic acid having 3 to 10 carbon atoms; and optionally about 2 to about 40 wt % of copolymerized units of a derivative of a second α,β-unsaturated carboxylic acid having 3 to 10 carbon atoms. Optionally, a portion of the carboxylic acid groups of the copolymerized units of the ethylene acid copolymer are neutralized to form carboxylate salts. The acid copolymer composition also includes a hydroxyl-containing crosslinking agent and may also include an adjuvant. The glass laminates have superior resistance to creeping due to the properties of the acid copolymer composition, which may optionally be cross-linked.

16 Claims, 5 Drawing Sheets

(56) References Cited

U.S. PATENT DOCUMENTS

| | | |
|---|---|---|
| 4,663,228 A | 5/1987 | Bolton et al. |
| 4,668,574 A | 5/1987 | Bolton et al. |
| 4,732,814 A | 3/1988 | Hatada et al. |
| 4,799,346 A | 1/1989 | Bolton et al. |
| 5,002,820 A | 3/1991 | Bolton et al. |
| 5,028,674 A | 7/1991 | Hatch et al. |
| 5,411,845 A | 5/1995 | Robinson |
| 5,415,909 A | 5/1995 | Shohi et al. |
| 5,415,942 A | 5/1995 | Anderson |
| 5,536,347 A | 7/1996 | Moran |
| 5,690,994 A | 11/1997 | Robinson |
| 5,698,329 A | 12/1997 | Robinson |
| 5,759,698 A | 6/1998 | Tanuma et al. |
| 5,763,062 A | 6/1998 | Smith et al. |
| 5,770,312 A | 6/1998 | Robinson |
| 5,853,516 A | 12/1998 | Lehto |
| 5,895,721 A | 4/1999 | Naoumenko et al. |
| 6,093,757 A | 7/2000 | Pern |
| 6,150,028 A | 11/2000 | Mazon |
| 6,265,054 B1 | 7/2001 | Bravet et al. |
| 6,342,116 B1 | 1/2002 | Balduin et al. |
| 6,432,522 B1 | 8/2002 | Friedman et al. |
| 6,500,888 B2 | 12/2002 | Baumgartner et al. |
| 6,518,365 B1 | 2/2003 | Powell et al. |
| 7,641,965 B1 | 1/2010 | Bennison et al. |
| 8,334,033 B2 | 12/2012 | Hausmann et al. |
| 8,399,096 B2 | 3/2013 | Hausmann et al. |
| 8,399,097 B2 | 3/2013 | Bennison et al. |
| 8,399,098 B2 | 3/2013 | Bennison et al. |
| 2002/0155302 A1 | 10/2002 | Smith et al. |
| 2003/0124296 A1 | 7/2003 | Smith |
| 2004/0182493 A1 | 9/2004 | Chick |
| 2004/0261931 A1* | 12/2004 | Narumiya ............. B29C 65/106 156/82 |
| 2006/0182983 A1 | 8/2006 | Paul et al. |
| 2007/0092706 A1 | 4/2007 | Pesek et al. |
| 2007/0122633 A1 | 5/2007 | Pesek et al. |
| 2007/0289693 A1 | 12/2007 | Anderson et al. |
| 2008/0044666 A1 | 2/2008 | Anderson et al. |
| 2008/0196760 A1* | 8/2008 | Hayes .................... B32B 17/10 136/256 |
| 2010/0112356 A1* | 5/2010 | Bennison ............... C08F 220/06 428/412 |

FOREIGN PATENT DOCUMENTS

| | | |
|---|---|---|
| WO | 99/58334 A1 | 11/1999 |
| WO | 03/057478 A1 | 7/2003 |
| WO | 03/068501 A1 | 8/2003 |
| WO | 2006/057771 A2 | 6/2006 |
| WO | 2007/149082 A2 | 12/2007 |

* cited by examiner

CROSS-LINKABLE ACID COPOLYMER COMPOSITION AND ITS USE IN GLASS LAMINATES

This application claims priority under 35 U.S.C. § 371 to International Application No. PCT/US2013/076333, filed on Dec. 19, 2013, which in turn claims priority under 35 U.S.C. §§ 119(e) and 365(c) to U.S. Provisional Appln. Nos. 61/739,557; 61/739,562; and 61/739,572, filed on Dec. 19, 2012, each of which is incorporated herein by reference in its entirety.

FIELD OF THE INVENTION

Provided herein are glass laminates, preferably safety glass laminates, that comprise a polymeric interlayer sheet formed of an acid copolymer composition. In particular, the interlayer sheet provides superior resistance to creeping due to the properties of the acid copolymer composition, which may optionally be cross-linked.

BACKGROUND OF THE INVENTION

Several patents and publications are cited in this description in order to more fully describe the state of the art to which this invention pertains. The entire disclosure of each of these patents and publications is incorporated by reference herein.

Safety laminates have been in commercial production for almost a century and have been utilized in applications that require sheet material having a high degree of clarity and impact resistance. For example, safety laminates have been widely used in the automobile industry as windshields or side windows because the laminate structures are characterized by high impact and penetration resistance and because they do not scatter glass shards and debris when shattered. More recently, safety laminates have also been incorporated into building structures as window, walls, stairs, and the like.

Simple safety laminates typically consist of a sandwich of two glass sheets or panels bonded together with an interlayer of a polymeric sheet. One or both of the glass sheets may be replaced with optically clear rigid polymeric sheets, such as sheets made of polycarbonate. Safety glass laminates have further evolved to include multiple layers of glass and polymeric sheets bonded together with interlayers of polymeric sheets.

The interlayers used in safety laminates are typically made from relatively thick polymer sheets, which exhibit toughness and bondability to the glass in the event of a crack or crash. Widely used interlayer materials include complex, multicomponent compositions based on poly(vinyl butyral), poly(urethane), and ethylene vinyl acetate copolymers.

Ionomers are copolymers produced by partially or fully neutralizing the carboxylic acid groups of precursor or parent polymers that are acid copolymers comprising copolymerized residues of α-olefins and α,β-ethylenically unsaturated carboxylic acids. The use of acid copolymer resins and ionomers in interlayer sheets in safety laminates is known. See, for example, U.S. Pat. Nos. 3,344,014; 3,762,988; 4,663,228; 4,668,574; 4,799,346; 5,759,698; 5,763,062; 5,895,721; 6,150,028; 6,265,054; 6,432,522; and 8,399,097; U.S. Patent Appln. Publn. Nos. 20020155302; 20020155302; 20060182983; 20070092706; 20070122633; 20070289693; 20080044666, and PCT Patent Appln. Publn. Nos. WO9958334; WO2006057771; and WO2007149082.

In this connection, ionomers have been useful in safety laminates intended for structures requiring a high degree of penetration resistance. Some examples include hurricane-resistant glazing and structural elements such as glass staircases and glass balustrades. In particularly demanding application, the use of ionomeric interlayer sheets in safety laminates having ballistic resistance is described in, e.g., U.S. Pat. Nos. 5,002,820 and 7,641,965; and PCT Patent Appln. Publn. No. WO03068501.

There is a continuing need to improve the physical and mechanical properties of interlayers for safety laminates. In particular, there is a need for interlayers that have the exceptional clarity associated with ethylene acid copolymers and their ionomers combined with the improved mechanical properties provided by cross-linking. Cross-linking occurs when chemical bonds are formed between polymeric moieties, producing polymeric networks that can enhance the overall strength of the crosslinked material. Crosslinked polymeric networks often exhibit improved elongation, mechanical integrity, tensile strength and resistance to break, compared with the polymers in an un-crosslinked state.

Various methods for crosslinking polymers are known. For example, ethylene vinyl acetate (EVA) copolymers used to form interlayer sheets and encapsulants for photovoltaic modules are often crosslinked with peroxides. Crosslinking of EVA with peroxide can form gel, however, and can lead to the degradation of the EVA. See, for example, U.S. Pat. No. 6,093,757, issued Jul. 25, 2000, to Pern.

Accordingly, there is a need to develop new methods of crosslinking ethylene acid copolymer resins and their ionomers, in order to improve their mechanical properties while retaining good processability in the melt, good optical properties, and good long-term stability so that they may be used in more advanced safety laminates.

SUMMARY OF THE INVENTION

Provided herein is a glass laminate comprising an interlayer sheet. The interlayer sheet comprises or is produced from an acid copolymer composition. The acid copolymer composition comprises an ethylene copolymer, and the ethylene copolymer comprises copolymerized units of ethylene, about 5 to about 90 wt % of copolymerized units of a first α,β-unsaturated carboxylic acid having 3 to 10 carbon atoms; and optionally about 2 to about 40 wt % of copolymerized units of a derivative of a second α,β-unsaturated carboxylic acid having 3 to 10 carbon atoms. These weight percentages of the copolymerized units are based on the total weight of the ethylene copolymer, and the sum of the weight percentages of the copolymerized units in the ethylene copolymer resin is 100 wt %. Optionally, at least a portion of the carboxylic acid groups of the copolymerized units of the α,β-unsaturated carboxylic acid units are neutralized to form carboxylate salts. The acid copolymer composition also includes a hydroxyl-containing crosslinking agent and may further include an adjuvant.

Further provided herein is a glass laminate with an interlayer that comprises a product of cross-linking the acid copolymer composition. In the cross-linked product, at least two of the carboxylic acid groups of the ethylene copolymer are reacted with two or more of the hydroxyl groups of the hydroxyl-containing crosslinking agent, to form cross-links between two or more ethylene copolymers.

DETAILED DESCRIPTION OF THE INVENTION

The following definitions apply to the terms as used throughout this specification, unless otherwise limited in specific instances.

The technical and scientific terms used herein have the meanings that are commonly understood by one of ordinary skill in the art to which this invention belongs. In case of conflict, the present specification, including the definitions herein, will control.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at a level that is appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Unless stated otherwise, all percentages, parts, ratios, and like amounts, are defined by weight.

Unless otherwise specified under limited circumstances, all melt flow rates are measured according to ASTM method D1238 at a polymer melt temperature of 190° C. and under a weight of 2.16 kg. Moreover, the terms melt flow rate (MFR), melt flow index (MFI) and melt index (MI) are synonymous and used interchangeably herein.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 15 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such.

The term "acid copolymer" as used herein refers to a polymer comprising copolymerized units of an α-olefin, an α,β-ethylenically unsaturated carboxylic acid, and optionally other suitable comonomer(s) such as, an α,β-ethylenically unsaturated carboxylic acid ester.

The term "(meth)acrylic", as used herein, alone or in combined form, such as "(meth)acrylate", refers to acrylic or methacrylic, for example, "acrylic acid or methacrylic acid", or "alkyl acrylate or alkyl methacrylate".

Finally, the term "ionomer", as used herein, refers to a polymer that comprises ionic groups that are carboxylate salts, for example, ammonium carboxylates, alkali metal carboxylates, alkaline earth carboxylates, transition metal carboxylates and/or combinations of such carboxylates. Such polymers are generally produced by partially or fully neutralizing the carboxylic acid groups of precursor or parent polymers that are acid copolymers, as defined herein, for example by reaction with a base. An example of an alkali metal ionomer as used herein is a sodium ionomer (or sodium neutralized mixed ionomer), for example a copolymer of ethylene and methacrylic acid wherein all or a portion of the carboxylic acid groups of the copolymerized methacrylic acid units are in the form of sodium carboxylate groups.

It has now surprisingly been found that a hydroxyl-containing crosslinking agent can cross-link ethylene acid copolymers or their ionomers in the melt, thus improving the mechanical properties that make the polymers useful in safety laminates. Without wishing to be held to theory, it is believed that the hydroxyl-containing crosslinking agent forms esters with the carboxylic acid groups of the ethylene acid copolymer or with the carboxylate groups of their ionomers. When two or more of the hydroxyl groups of the crosslinking agent react with the polymer functional groups in this way, intermolecular or intramolecular crosslinking occurs.

Accordingly, provided herein is a glass laminate comprising at least one rigid sheet layer or at least one film layer and at least one interlayer sheet, wherein the interlayer sheet comprises an acid copolymer composition. The acid copolymer composition comprises an ethylene copolymer, which in turn comprises copolymerized units of ethylene, about 5 to about 90 wt % of copolymerized units, preferably about 5 to about 30 wt % of copolymerized units, of a first α,β-unsaturated carboxylic acid having 3 to 10, preferably 3 to 8, carbon atoms; and optionally about 2 to about 40 wt % or preferably from about 5 to 30 weight percent, of copolymerized units of a derivative of a second α,β-unsaturated carboxylic acid having 3 to 10, preferably 3 to 8, carbon atoms. The weight percentages of the copolymerized units are based on the total weight of the ethylene copolymer, and the sum of the weight percentages of the copolymerized units in the ethylene copolymer resin is 100 wt %. Optionally, at least a portion of the carboxylic acid groups of the copolymerized units of the α,β-unsaturated carboxylic acid units are neutralized to form carboxylate salts. The polymer composition further comprises a hydroxyl-containing crosslinking agent, and, optionally, also comprises an adjuvant.

Suitable α-olefin comonomers include, but are not limited to, ethylene, propylene, 1-butene, 1-pentene, 1-hexene, 1-heptene, 3 methyl-1-butene, 4-methyl-1-pentene, and the like and mixtures of two or more thereof. In one preferred ethylene copolymer, the α-olefin is ethylene.

Suitable α,β-ethylenically unsaturated acid comonomers include, but are not limited to, carboxylic acids, including acrylic acids, methacrylic acids, itaconic acids, maleic acids, fumaric acids, and mixtures of two or more thereof. In one preferred ethylene copolymer, the first α,β-ethylenically unsaturated carboxylic acid is selected from acrylic acids, methacrylic acids, and mixtures of two or more thereof. In another preferred ethylene copolymer, the α,β-ethylenically unsaturated carboxylic acid is methacrylic acid.

The ethylene copolymers may further comprise copolymerized units of one or more other comonomer(s), such as a second α,β-ethylenically unsaturated carboxylic acid having 3 to 10, or preferably 3 to 8 carbons, or derivatives thereof. Suitable acid derivatives include acid anhydrides, amides, and esters. Esters are preferred; alkyl esters are more preferred. Specific examples of preferred esters of α,β-ethylenically unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol) acrylates, poly(ethylene glycol) methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly(ethylene glycol) 4-nonylphenyl ether methacrylates, poly(ethylene glycol) phenyl ether acrylates, poly(ethylene glycol) phenyl ether methacrylates, maleic anhydrides, monomethyl esters of maleic acids, dimethyl maleates, diethyl maleates, dibutyl maleates, dimethyl fumarates, diethyl fumarates, dibutyl fumarates, dimethyl fumarates, vinyl acetates, vinyl propionates, and mixtures of two or more thereof. In one preferred ethylene copolymer, the suitable additional comonomers are selected from methyl acrylates, methyl methacrylates, butyl acrylates, butyl methacrylates, glycidyl methacrylates, vinyl acetates, and combinations of two or more thereof. In another preferred ethylene copolymer, however, the precursor acid copolymer does not incorporate other additional comonomers. In one preferred ethylene copolymer, the first α,β-ethylenically unsaturated carboxylic acid is the same as the second α,β-ethylenically unsaturated carboxylic acid; in another preferred ethylene copolymer, however, the first and the second α,β-ethylenically unsaturated carboxylic acids are different.

Suitable ethylene copolymers have a melt flow rate (MFR) of about 1 to about 4000 g/10 min, or about 1 to 1000 g/10 min, or about 20 to about 400 g/10 min, as determined in accordance with ASTM method D1238-89 at 190° C. and 2.16 kg.

Finally, suitable ethylene copolymers may be synthesized as described in U.S. Pat. Nos. 3,404,134; 5,028,674; 6,500,888; 6,518,365, or 8,399,096, for example.

Alternatively, the acid copolymer composition may include an ionomer obtained by neutralizing the ethylene copolymer. After neutralization, about 1% to about 90%, or about 10% to about 60%, or about 20% to about 55%, of the hydrogen atoms of carboxylic acid groups present in the precursor acid are replaced by other cations. Stated alternatively, about 1% to about 90%, or about 10% to about 60%, or about 20% to about 55%, of the total content of the carboxylic acid groups present in the precursor acid copolymer are neutralized. In another alternative expression, the acid groups are neutralized to a level of about 1% to about 90%, or about 10% to about 60%, or about 20% to about 55%, based on the total content of carboxylic acid groups present in the precursor acid copolymers as calculated or measured for the non-neutralized precursor acid copolymers. The neutralization level can be tailored for the specific end-use.

The ionomers comprise cations as counterions to the carboxylate anions. Suitable cations include any positively charged species that is stable under the conditions in which the ionomer composition is synthesized, processed and used. In some preferred ionomers, the cations used are metal cations, which may be monovalent, divalent, trivalent, multivalent, or mixtures thereof. Useful monovalent metal cations include but are not limited to cations of sodium, potassium, lithium, silver, mercury, copper, and the like, and mixtures thereof. Useful divalent metal cations include but are not limited to cations of beryllium, magnesium, calcium, strontium, barium, copper, cadmium, mercury, tin, lead, iron, cobalt, nickel, zinc, and the like, and mixtures thereof. Useful trivalent metal cations include but are not limited to cations of aluminum, scandium, iron, yttrium, and the like, and mixtures thereof. Useful multivalent metal cations include but are not limited to cations of titanium, zirconium, hafnium, vanadium, tantalum, tungsten, chromium, cerium, iron, and the like, and mixtures thereof. It is noted that when the metal cation is multivalent, complexing agents such as stearate, oleate, salicylate, and phenolate radicals may be included, as described in U.S. Pat. No. 3,404,134. In another preferred composition, the metal cations used are monovalent or divalent metal cations. Preferred metal cations are sodium, lithium, magnesium, zinc, potassium and mixtures thereof. In yet another preferred composition, the cations of sodium, zinc and mixtures thereof are more preferred.

The resulting neutralized ionomer will have a melt index, as determined in accordance with ASTM method D1238-89 at 190° C. and 2.16 kg, that is lower than that of the corresponding ethylene copolymer.

To obtain the ionomers used herein, the precursor acid copolymers may be neutralized by any conventional procedure, such as those disclosed in U.S. Pat. Nos. 3,404,134 and 6,518,365, and by other procedures that will be apparent to those of ordinary skill in the art. Some of these methods are described in detail in U.S. Pat. No. 8,334,033, issued to Hausmann et al.

The acid copolymer composition also includes a hydroxyl-containing crosslinking agent. As used herein, the term "hydroxyl-containing crosslinking agent" refers to any molecule that is miscible with the ethylene copolymer and that has two or more hydroxyl groups. Generally, any hydroxyl-containing crosslinking agent is believed to be suitable for use in the acid copolymer composition. Combinations of two or more hydroxyl-containing crosslinking agents may also be used. Examples of suitable hydroxyl-containing crosslinking agents include, without limitation, dihydroxyl, trihydroxyl and multihydroxyl compounds. Of note are glycols, such as propylene glycol; sorbitol; glycerol; poly(alkylene glycols), such as PEG600 and PEG2000; glycerol monstearate; and polyvinyl alcohol. Preferred are diols, such as 1,4-butanediol, 1,3-propanediol and 1,6-hexanediol. 1,4-Butanediol is particularly preferred.

The hydroxyl-containing crosslinking agent is included in the acid copolymer composition in an amount of up to about 5 wt %, preferably about 2 wt % or less or about 1.5 wt % or less, more preferably about 1 wt % or less, 0.5 wt % or less, or 0.25 wt % or less, or 0.1 wt %, based on total weight of the acid copolymer composition.

The hydroxyl-containing crosslinking agent can be added to the ionomer in any convenient manner. In one particularly useful method, the agent is added to the ionomer flake in the pre-mix chamber of an extruder. In another suitable method, the agent is introduced through an injection port. As these materials are mixed, generally by tumbling or dry-auger blending, before going into the extruder, the cross-linking agent is incorporated into the polymer composition and reacts so that the cross-linking occurs in the ionomer as it is extruded. Alternatively, the cross-linking reaction can take place during melt mixing or extrusion of the melt.

The acid copolymer composition further optionally comprises one or more adjuvants. The term "adjuvant" as used herein refers to "additives that contribute to the effectiveness of the primary ingredient" (The Condensed Chemical Dictionary, 10$^{th}$ Ed., revised by Gessner G. Hawley, Van Nostrand Reinhold Co., New York, N.Y., 1981). Without wishing to be held to theory, it is believed that the adjuvants contribute to the effectiveness of the crosslinking agent(s), for example by enhancing the kinetics of the acid or base catalysis. Examples of suitable adjuvants include silanes. When silanes are used, they can be added in amounts of between 0.025 and 0.1 weight percent (wt %), based on the total weight of the acid copolymer composition. Non-limiting examples of preferred silanes include N-(2-aminoethyl-3-aminopropyl)trimethoxysilane, 3-glycidoxypropyl trimethoxysilane, and combinations thereof. These silanes are commercially available from several sources, including the Dow Corning Corporation of Midland, Mich.

The optional adjuvant(s), when used, are added to the base resin in amounts of about 0.025, 0.25, 0.1, or 1.0 wt %, based on the total weight of the acid copolymer composition. The adjuvant can be added at the same time and in the same manner as the hydroxyl-containing crosslinking agent, or by any other suitable method.

The polymer composition described herein may further contain other additives known within the art. The additives include, but are not limited to, processing aids, flow enhancing additives, lubricants, pigments, dyes, flame retardants, impact modifiers, nucleating agents, anti-blocking agents such as silica, thermal stabilizers, UV absorbers, UV stabilizers, dispersants, surfactants, chelating agents, coupling agents, reinforcement additives, such as glass fiber, fillers and the like. General information about suitable additives, suitable levels of the additives in the ionomeric polymers, and methods of incorporating the additives into the ionomeric polymers may be found in reference texts such as, for example, the *Kirk Othmer Encyclopedia, the Modern Plastics Encyclopedia*, McGraw-Hill (New York, 1995) or the *Wiley Encyclopedia of Packaging Technology*, 2d edition, A. L. Brody and K. S. Marsh, Eds., Wiley-Interscience (Hoboken, 1997). Four types of additives are of note for use in the ionomeric polymers, specifically thermal stabilizers, UV absorbers, hindered amine light stabilizers (HALS), and silane coupling agents.

Further information about these four types of additives, such as preferred examples and suitable levels in ionomeric polymers, may be found in the reference texts cited above and in U.S. Pat. No. 7,641,965, for example. Briefly, however, these conventional ingredients may be present in the compositions in quantities of about 0.01 to about 15 wt %, or about 10 wt %, or about 5 wt %, or about 2 wt %, or about 1 wt %, so long as they do not detract from the basic and novel characteristics of the composition and do not significantly adversely affect the performance of the composition or of the articles prepared from the composition. In this connection, the weight percentages of such additives are not included in the total weight percentages of the acid copolymer compositions defined herein.

Further provided herein is a glass laminate in which the interlayer comprises a product of cross-linking the acid copolymer composition, so that at least a portion of the carboxylic acid groups of one or more ethylene copolymer molecules are reacted with at least two hydroxyl groups of a molecule of the hydroxyl-containing crosslinking agent, thereby forming cross-links between or within the ethylene copolymer molecules. In one preferred embodiment, at least a portion of the carboxylic acid groups of two or more ethylene copolymer molecules are reacted with at least two hydroxyl groups of a molecule of the hydroxyl-containing crosslinking agent, thereby forming cross-links between the ethylene copolymer molecules.

Those of skill in the art are able to determine an appropriate level of cross-linking based on the physical properties that are desired in the cross-linked composition. For example, higher levels of cross-linking are correlated with a higher flex modulus, better high temperature adhesion, lower melt indices, and better heat resistance. The level of cross-linking may be adjusted so that the desired end use performance is obtained. For example, a level of cross-linking may be desirable at which the creep or displacement properties are controlled or minimized at the expected stress level and temperature range for said article. A level chosen by these criteria allows for the ease of processing of the cross-linked resin, through extrusion and any other secondary or forming/shaping process.

Those of skill in the art are also aware that the time required to obtain a desired level of cross-linking depends directly on the concentration of carboxylic acid groups and hydroxyl-containing groups. Likewise, the time required to obtain a desired level of cross-linking can depend inversely on the temperature at which the cross-linking reaction is carried out, and also can depend inversely or in another negative logarithmic relationship on the melt index of the polymer blend.

Cross-linking reactions can require heat, but the reaction may also be carried out using catalysis, or by using a combination of heat and catalysis. For example, esterification reactions are known to be catalyzed by acid catalysts and by base catalysts.

Without wishing to be held to theory, it is hypothesized that during the extrusion process, the crosslinking agent and the adjuvant compound, if used, will react with the acid copolymer or ionomer resin to form a low-density level of crosslinks in at least an intermolecular fashion. The cross-linking agent can react with carboxylic acid groups, thus forming an ester-bond, and can additionally react via transesterification with existing or thus-formed ester-bonds. This reactivity can be controlled via selection of the crosslinking agent and specific resin composition containing reactive functional groups. One skilled in the art can utilize conventional understanding of relative reactivity and dependencies on adjacent chemical groups/atoms, steric hindrance, and other molecular/structural effects. Again without wishing to be held to theory, it is hypothesized that the adjuvant compound enhances the crosslink density by forming or by promoting the formation of ester-bonds. Additionally, the choice of other pendant functional groups within silane adjuvants may enable other reactions to occur. For example, amino-groups could form an amide bond and epoxy groups can react with hydroxyl groups to form additional hydroxyl side-groups. Alternatively, epoxy groups may initiate various other reactions via a free-radical pathway.

In the case of extrusion processing, discussed briefly above, the typical temperature range is generally between about 120° C. and 300° C., depending on the melt point, melt viscosity and specific equipment configuration. The reaction will be dependent on the time and temperature parameters set forth and established through the entire series of process steps. The degree of reaction can be affected by the level of moisture within the resin, or any added moisture. In general, increased levels of moisture decrease the degree of reaction. Depending on the desired end result, this may be an undesirable effect. Alternatively, moisture can advantageously be used as a limiting means to reduce the extent of the cross-linking. Catalysts may also be included, such as the creation of either acid or base conditions to catalyze the cross-linking. Alternatively, a specific catalyst, such as dibutyl tin oxide or similar compound, could be employed.

The resulting cross-linked acid copolymer composition may have a MFR of 25 g/10 min or less, or about of 20 g/10 min or less, or about 10 g/10 min or less, or about 5 g/10 min or less, or about 0.7 to about 5 g/10 min, as determined in accordance with ASTM method D1238-89 at 190° C. and 2.16 kg.

Further provided herein is a polymeric interlayer sheet for use in safety laminates. The interlayer sheet comprises the acid copolymer composition described herein. It may have a single layer or multilayer form. By "single layer", it is meant that the sheet is made of or consists essentially of the acid copolymer composition disclosed herein. When in a multilayer form, the interlayer sheet is made up of two or more sub-layers and at least one of the sub-layers is made of or consists essentially of the acid copolymer composition, while the other sub-layer(s) may be made of any other suitable polymeric material(s), such as, for example, acid copolymers as defined above, ionomers as defined above, ethylene/vinyl acetate copolymers, poly(vinyl acetals) (including acoustic grade poly(vinyl acetals)), polyurethanes, polyvinylchlorides, polyethylenes (e.g., linear low density polyethylenes), polyolefin block elastomers, copolymers of α-olefins and α,β-ethylenically unsaturated carboxylic acid esters (e.g., ethylene methyl acrylate copolymers and ethylene butyl acrylate copolymers), silicone elastomers, epoxy resins, and combinations of two or more thereof. In addition, when two or more sublayers are present in the polymeric interlayer sheets, the sublayers may be formed of polymeric materials that are the same or different.

Further, the interlayer sheet comprising the acid copolymer composition may have a smooth or rough surface on one or both sides to facilitate deaeration during the lamination process. Rough surfaces can be created by known processes such as mechanical embossing or by melt fracture during extrusion of the sheets, or by processes described in, e.g., U.S. Pat. No. 4,035,549 and U.S. Patent Publication No. 2003/0124296.

The interlayer sheets comprising the acid copolymer compositions may be produced by any suitable process. For example, the sheets may be formed through dipcoating, solution casting, compression molding, injection molding, lamination, melt extrusion, blown film, extrusion coating, tandem extrusion coating, or by any other procedures that are known to those of skill in the art. In particular, the sheets may be formed by melt extrusion, melt coextrusion, melt extrusion coating, blown film process, or tandem melt extrusion coating processes.

One preferred safety laminate comprises at least one interlayer sheet comprising the acid copolymer composition, and the interlayer sheet is laminated to at least one rigid sheet or film layer. By "laminated", it is meant that, within a laminated structure, the two layers are adhered or bonded either directly (i.e., without any additional material between the two layers) or indirectly (i.e., with additional material, such as interlayer or adhesive materials, between the two layers).

Suitable rigid sheets comprise a material with a modulus of about 100,000 psi (690 MPa) or greater (as measured by ASTM Method D-638). The rigid sheets used here may be formed of glass, metal, ceramic, or of polymers including polycarbonates, acrylics, polyacrylates, cyclic polyolefins, polystyrene prepared in the presence of metallocene catalysts, and combinations of two or more thereof. Other suitable rigid sheets are described in U.S. Pat. No. 8,399,098, issued to Bennison et al.

The film layers used herein may be metal (such as aluminum foil) or polymeric. Suitable polymeric film materials include, but are not limited to, those described in U.S. Pat. No. 8,399,098, cited above.

When the polymeric film is located at the outside surface of the safety laminate, it may be further coated with an abrasion resistant hardcoat. Any material known for use in abrasion resistant hardcoats may be used herein. Suitable materials include, but are not limited to, those described in U.S. Pat. No. 8,399,098, cited above.

The safety laminates may further comprise other polymeric interlayer sheets formed of polymeric materials, such as poly(vinyl acetal) (e.g., poly(vinyl butyral) (PVB)), poly(vinyl chloride), polyurethane, ethylene/vinyl acetate copolymers, acid copolymers, other ionomers, or combinations of two or more thereof. In addition, when two or more polymeric sheets are incorporated in the safety laminate, the polymeric interlayer sheets may be formed of polymeric materials that are the same or different.

Each of the interlayer sheets comprising the acid copolymer compositions and each of the other polymeric interlayer sheets comprised in the safety laminates may have a thickness of at least about 5 mils (0.1 mm), or at least about 30 mils (0.8 mm), or about 30 to about 200 mils (about 0.8 to about 5.1 mm), or about 45 to about 200 mils (about 1.1 to about 5.1 mm), or about 45 to about 100 mils (about 1.1 to about 2.5 mm), or about 45 to about 90 mils (about 1.1 to about 2.3 mm).

One preferred safety laminate comprises (a) a first rigid sheet or film layer, which is laminated to (b) a sheet comprising the acid copolymer composition, which is laminated to (c) a second rigid sheet or film layer. For example, the safety laminate may comprise two glass sheets with an interlayer sheet comprising the acid copolymer composition laminated between the two glass sheets, or the safety laminate may comprise a glass sheet and a hardcoated polyester film with an interlayer sheet comprising the acid copolymer composition laminated between the glass sheet and the hardcoated plastic film.

Another safety laminate may comprise n plies of rigid sheet or film layers (such as glass sheet layers) and n−1 plies of polymer interlayer sheets, wherein (a) each adjacent pair of the rigid sheet or film layers are interspaced by one of the polymer interlayer sheets; (b) at least one, or preferably each, of the polymer interlayer sheets is the interlayer sheet disclosed above, and (c) n is an integer and $2 \leq n \leq 10$. Such safety laminates are described at length in U.S. Pat. No. 7,641,965, issued to Bennison et al.

Some examples of preferred safety laminates include, but are not limited to, rigid sheet/interlayer sheet; polymer film/interlayer sheet; rigid sheet/interlayer sheet/polymer film; rigid sheet/interlayer sheet/rigid sheet; polymeric film/interlayer sheet/polymer film; rigid sheet/interlayer sheet/polymer film/interlayer sheet/rigid sheet; and others set forth in U.S. Pat. No. 8,399,098, cited above, wherein "/" indicates adjacent layers. Moreover, when two or more of any film or sheet occur in the same laminate, they may be the same as or different from each other, provided that at least one of the interlayer sheets comprises or is produced from the acid copolymer composition described herein. Furthermore, in some preferred laminates, the adjacent layers are laminated directly to each other so that they are adjoining or, more preferably, contiguous in the laminate structure.

Further provided herein are safety laminates having ballistic resistance. Ballistic resistant safety laminates may comprise multiple rigid sheets, such as glass sheets, and multiple polymer interlayer sheets, wherein each adjacent pair of the rigid sheets is interspaced by one of the polymer interlayer sheets and at least one of the polymer interlayer sheets is the interlayer sheet described above.

The ballistic resistant safety laminate may further comprise a polymer film positioned in the laminate as an outermost layer facing away from the impact force. Preferably, the polymer film is selected from polyester films described in U.S. Pat. No. 8,399,098, cited above.

In yet another example, the ballistic resistant safety laminate comprises an impact zone and, adhered firmly to the impact zone, an anti-spall zone, wherein the impact zone faces to the impact force and comprises n glass sheets and (n−1) polymer interlayer sheets with (i) each adjacent pair of the glass sheets interspaced by one of the polymer interlayer sheet; (ii) n being an integer of 2-10; and (iii) at least one of the polymer interlayer sheets being the interlayer sheet disclosed above; and wherein the anti-spall zone faces away from the impact force and comprises an additional polymer sheet (e.g., a PVB sheet) and a polymer film (e.g., a PET film) with a first surface of the polymer sheet adhered firmly to the impact zone and a second surface of the polymer sheet adhered firmly to the polymer film. Safety laminates of this type are described in greater detail in U.S. Pat. No. 7,641,965, cited above.

The ballistic resistant safety laminates may take any form known within the art. Some specific constructions include, but are not limited to, rigid sheet/interlayer sheet/rigid sheet/interlayer sheet/rigid sheet;

glass sheet/interlayer sheet/glass sheet/interlayer sheet/glass sheet;

glass sheet/interlayer sheet/glass sheet/interlayer sheet/rigid sheet;

rigid sheet/interlayer sheet/rigid sheet/polymer sheet/rigid sheet;

glass sheet/interlayer sheet/glass sheet/polyurethane sheet/polycarbonate sheet;

glass sheet/interlayer sheet/glass sheet/polymer sheet/acrylic rigid sheet;

rigid sheet/interlayer sheet/rigid sheet/interlayer sheet/polymer film (e.g., hardcoated bi-axially oriented pet film);

glass sheet/interlayer sheet/glass sheet/interlayer sheet/polymer film;

rigid sheet/interlayer sheet/rigid sheet/polymer sheet/polymer film;

glass sheet/interlayer sheet/glass sheet/polymer sheet/polymer film;

rigid sheet/interlayer sheet/rigid sheet/pvb sheet/polymer film;

glass sheet/interlayer sheet/glass sheet/pvb sheet/bi-axially oriented pet film,
rigid sheet/interlayer sheet/rigid sheet/interlayer sheet/rigid sheet/interlayer sheet/rigid sheet;
glass sheet/interlayer sheet/glass sheet/interlayer sheet/glass sheet/interlayer sheet/glass sheet;
glass sheet/interlayer sheet/glass sheet/interlayer sheet sheet/glass sheet/interlayer sheet/rigid sheet;
rigid sheet/interlayer sheet/rigid sheet/interlayer sheet/rigid sheet/polymer sheet/rigid sheet;
glass sheet/interlayer sheet/glass sheet/interlayer sheet/glass sheet/polyurethane sheet/polycarbonate sheet;
glass sheet/interlayer sheet/glass sheet/interlayer sheet/glass sheet/polymer sheet/acrylic rigid sheet;
rigid sheet/interlayer sheet/rigid sheet/interlayer sheet/rigid sheet/interlayer sheet/polymer film;
glass sheet/interlayer sheet/glass sheet/interlayer sheet/glass sheet/interlayer sheet/polymer film;
rigid sheet/interlayer sheet/rigid sheet/interlayer sheet/rigid sheet/polymer sheet/polymer film;
glass sheet/interlayer sheet/glass sheet/interlayer sheet/glass sheet/polymer sheet/polymer film;
glass sheet/interlayer sheet/glass sheet/interlayer sheet/glass sheet/polymer sheet/bi-axially oriented pet film;
glass sheet/interlayer sheet/glass sheet/interlayer sheet/glass sheet/pvb sheet/bi-axially oriented pet film;
rigid sheet/interlayer sheet/rigid sheet/interlayer sheet/rigid sheet/interlayer sheet/rigid sheet/interlayer sheet/rigid sheet;
glass sheet/interlayer sheet/glass sheet/interlayer sheet/glass sheet/interlayer sheet/glass sheet/interlayer sheet/glass sheet;
glass sheet/interlayer sheet/glass sheet/interlayer sheet sheet/glass sheet/interlayer sheet/glass sheet/interlayer sheet/rigid sheet;
rigid sheet/interlayer sheet/rigid sheet/interlayer sheet/rigid sheet/interlayer sheet/rigid sheet/polymer sheet/rigid sheet;
glass sheet/interlayer sheet/glass sheet/interlayer sheet/glass sheet/interlayer sheet/glass sheet/polyurethane sheet/polycarbonate sheet;
glass sheet/interlayer sheet/glass sheet/interlayer sheet/glass sheet/interlayer sheet/glass sheet/polymer sheet/acrylic rigid sheet;
rigid sheet/interlayer sheet/rigid sheet/interlayer sheet/rigid sheet/interlayer sheet/rigid sheet/interlayer sheet/polymer film;
glass sheet/interlayer sheet/glass sheet/interlayer sheet/glass sheet/interlayer sheet/glass sheet/interlayer sheet/polymer film;
rigid sheet/interlayer sheet/rigid sheet/interlayer sheet/rigid sheet/interlayer sheet/rigid sheet/polymer sheet/polymer film;
glass sheet/interlayer sheet/glass sheet/interlayer sheet/glass sheet/interlayer sheet/glass sheet/polymer sheet/polymer film;
glass sheet/interlayer sheet/glass sheet/interlayer sheet/glass sheet/interlayer sheet/glass sheet/polymer sheet/bi-axially oriented pet film;
glass sheet/interlayer sheet/glass sheet/interlayer sheet/glass sheet/interlayer sheet/glass sheet/pvb sheet/bi-axially oriented pet film;
rigid sheet/interlayer sheet/rigid sheet/interlayer sheet/rigid sheet/interlayer sheet/rigid sheet/interlayer sheet/rigid sheet/interlayer sheet/rigid sheet;
glass sheet/interlayer sheet/glass sheet/interlayer sheet/glass sheet/interlayer sheet/glass sheet/interlayer sheet/glass sheet/interlayer sheet/glass sheet;
rigid sheet/interlayer sheet/rigid sheet/interlayer sheet/rigid sheet/interlayer sheet/rigid sheet/interlayer sheet/rigid sheet/polymer sheet/polymer film; and
glass sheet/interlayer sheet/glass sheet/interlayer sheet/glass sheet/interlayer sheet/glass sheet/interlayer sheet/glass sheet/polymer sheet/polymer film;

wherein the same notes apply as above with respect to other preferred safety laminates; specifically, repeated layers may be the same or different, and "/" indicates layers that may be adjacent, adjoining or contiguous.

If desired, one or both surfaces of any of the component layers comprised in the safety laminate may be treated prior to the lamination process to enhance the adhesion to other laminate layers. This adhesion enhancing treatment may take any form known within the art and includes flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, corona discharge treatments, chemical treatments, chromic acid treatments, hot air treatments, ozone treatments, ultraviolet light treatments, sand blast treatments, solvent treatments, and combinations of two or more thereof. Also, the adhesion strength may be further improved by further applying an adhesive or primer coating on the surface of the laminate layer(s). For example, U.S. Pat. No. 4,865,711 discloses a film or sheet with improved bondability, which has a thin layer of carbon deposited on one or both surfaces. Other examples of adhesives and primers include, without limitation, silanes, poly(allyl amine) based primers (see, e.g., U.S. Pat. Nos. 5,411,845; 5,770,312; 5,690,994; and 5,698,329), and acrylic based primers (see, e.g., U.S. Pat. No. 5,415,942). The adhesive or primer coating may take the form of a monolayer of the adhesive or primer and have a thickness of about 0.0004 to about 1 mil (about 0.00001 to about 0.03 mm), or preferably, about 0.004 to about 0.5 mil (about 0.0001 to about 0.013 mm), or more preferably, about 0.004 to about 0.1 mil (about 0.0001 to about 0.003 mm).

Any suitable lamination process may be used to prepare the safety laminates. For example, the laminate may be made by an autoclave process, such as those described in U.S. Pat. No. 3,311,517, or a non-autoclave lamination process, such as those described in U.S. Pat. Nos. 3,234,062; 3,852,136; 4,341,576; 4,385,951; 4,398,979; 5,536,347; 5,853,516; 6,342,116; and 5,415,909, U.S. Patent Publication No. 2004/0182493, European Patent No. EP 1 235 683 B1, and PCT Patent Publication Nos. WO91/01880 and WO03057478.

The following examples are provided to describe the invention in further detail. These examples, which set forth a preferred mode presently contemplated for carrying out the invention, are intended to illustrate and not to limit the invention.

EXAMPLES OF THE INVENTION

Materials and Methods

"Resin A" was an ionomer of an ethylene acid copolymer comprising copolymerized repeat units of ethylene and about 21.7 wt % of copolymerized repeat units of methacrylic acid. Resin A was neutralized to a level of about 26% with a base having sodium cations as counterions. The melt index of the Resin A base resin was about 24 g/10 min, and that of Resin A was about 1.8 g/10 min.

The polymers and additives were blended and extruded using a 28-mm twin-screw compounding extruder manufactured by the Werner-Pfleiderer Corp. of Tamm, Germany. The extruder was equipped with a 6-mm single hole die and the melt strand was passed through a water bath for cooling and then cut into pellets using a Conair cutter.

1,4-Butanediol was obtained from the Aldrich Chemical Company, Inc., (Cat. No. B8, 480-7, 99% purity) and added to the base resin in amounts of 1.0, 1.5 and 2.0 wt %.

Example 1 continued to elongate to at least 1400% over a period of greater than 500 hours, without a loss of mechanical integrity.

Figure 2:
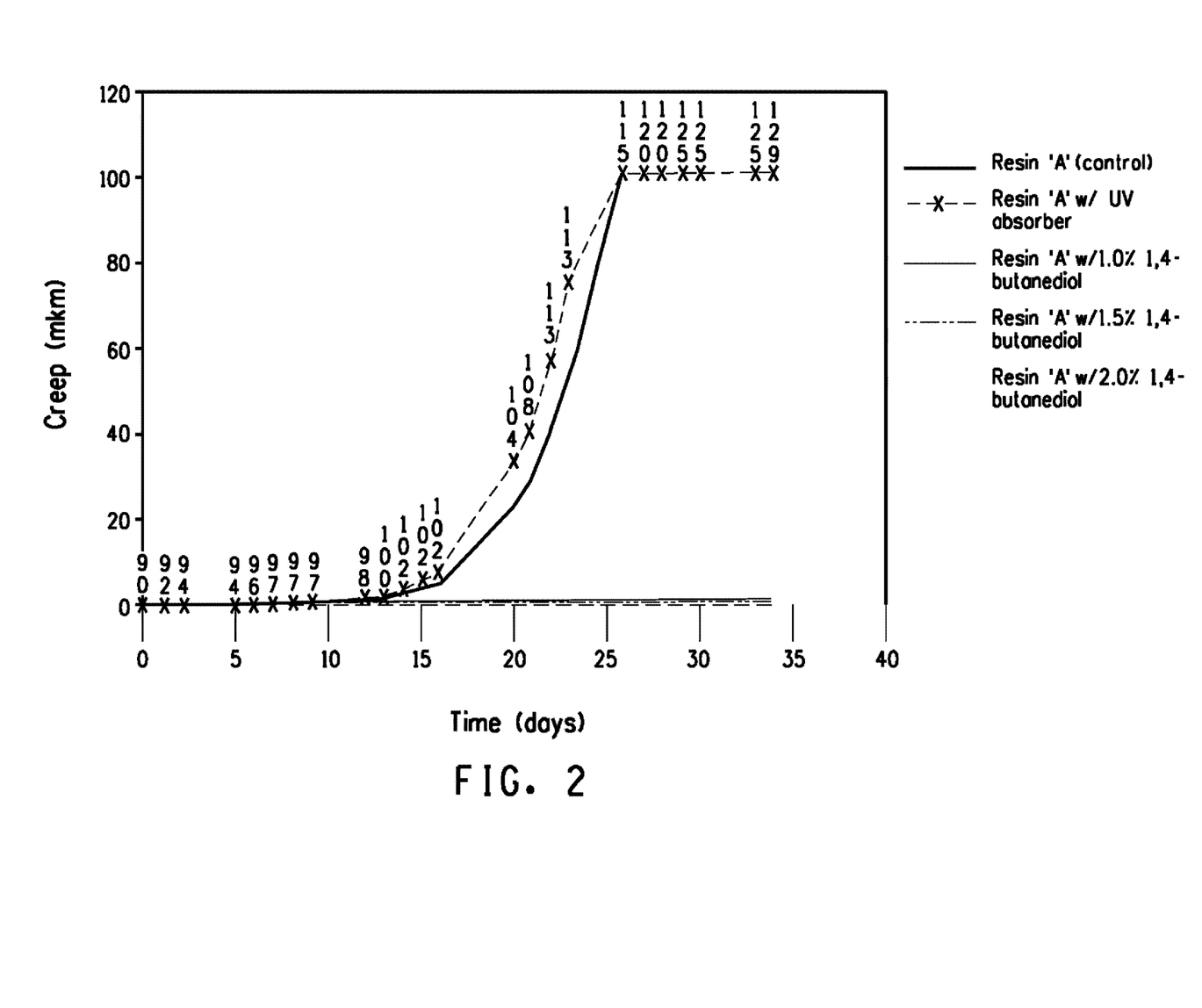
FIG. 2 is a graphical representation of the laminate creep resistance of several polymer compositions of the invention compared to that of a control material.
Figure 3:
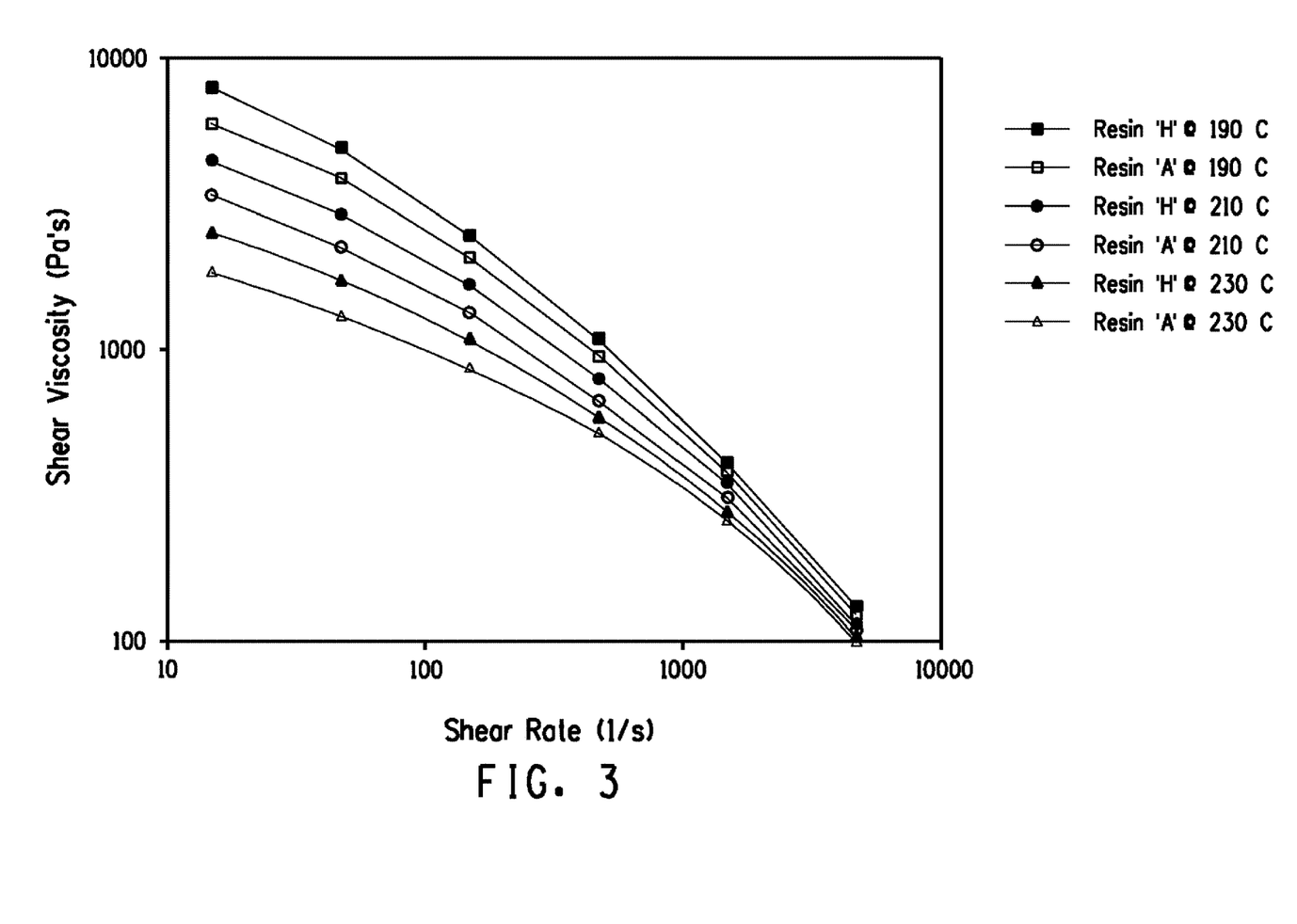
FIG. 3 is a graphical representation of the viscosity shear rate of a polymer composition of the invention compared to that of a control material.

Differential scanning calorimetry (DSC) traces were obtained according to ASTM D3418-08, using a Model DSC 821 differential scanning calorimeter available from Mettler Toledo, Inc., of Columbus, Ohio. The results are shown in FIGS. 2 and 3.

TABLE 1

| | Time, hr | | | | | | | | | | | | | | |
|---|---|---|---|---|---|---|---|---|---|---|---|---|---|---|---|
| | 0 | 16 | 24 | 92 | 116 | 140 | 164 | 188 | 262 | 284 | 287 | 290 | 307 | 315 | 334 |
| | Temp, deg C. | | | | | | | | | | | | | | |
| | 23 | 70 | 75 | 75 | 78 | 80 | 80 | 80 | 82 | 82 | 84 | 89 | 89 | 89 | 89 |
| EXAMPLE RESIN 'A' with 1.0 wt % 1,4-butanediol | | | | | | | | | | | | | | | |
| Elongation in mm | | | | | | | | | | | | | | | |
| Sample 1 | 5.0 | 7.0 | 8.0 | 8.0 | 9.0 | 11.0 | 11.0 | 11.5 | 14.5 | 14.5 | 14.5 | 26.0 | 33.0 | 35.0 | 41.0 |
| Sample 2 | 5.0 | 7.5 | 8.5 | 9.5 | 10.5 | 12.0 | 12.5 | 12.5 | 15.0 | 15.5 | 16.0 | 29.0 | 37.0 | 38.0 | 44.0 |
| Sample 3 | 5.0 | 8.0 | 8.0 | 9.0 | 10.5 | 12.0 | 12.5 | 12.5 | 15.0 | 16.0 | 16.0 | 29.5 | 38.0 | 39.0 | 45.0 |
| Sample 4 | 5.0 | 7.0 | 8.0 | 9.0 | 9.5 | 11.0 | 11.5 | 12.5 | 15.0 | 15.0 | 15.0 | 29.0 | 37.5 | 39.0 | 43.0 |
| Distance | 10.0 | 15.5 | 16.5 | 18.5 | 21.0 | 24.0 | 25.0 | 25.0 | 30.0 | 31.5 | 32.0 | 58.5 | 75.0 | 77.0 | 89.0 |
| Percent Elongation | 0.0 | 55.0 | 65.0 | 85.0 | 110.0 | 140.0 | 150.0 | 150.0 | 200.0 | 215.0 | 220.0 | 485.0 | 650.0 | 670.0 | 790.0 |
| COMPARATIVE EXAMPLE RESIN 'A" (control) | | | | | | | | | | | | | | | |
| Elongation in mm | | | | | | | | | | | | Broke | | | |
| Sample CA1 | 5.0 | 7.0 | 8.0 | 9.0 | 11.0 | 14.0 | 14.5 | 15.0 | 20.5 | 21.0 | 21.0 | | | | |
| Sample CA2 | 5.0 | 8.0 | 9.0 | 10.0 | 12.0 | 14.5 | 16.0 | 16.5 | 22.5 | 24.5 | 24.5 | | | | |
| Sample CA3 | 5.0 | 7.0 | 8.5 | 9.5 | 11.0 | 14.0 | 15.0 | 15.5 | 21.0 | 23.0 | 23.0 | | | | |
| Sample CA4 | 5.0 | 7.0 | 8.0 | 9.0 | 10.0 | 13.0 | 14.0 | 14.5 | 20.0 | 21.0 | 21.0 | | | | |
| Distance | 10.0 | 15.0 | 17.5 | 19.5 | 23.0 | 28.5 | 31.0 | 32.0 | 43.5 | 47.5 | 47.5 | 0.0 | | | |
| Percent Elongation | 0.0 | 50.0 | 75.0 | 95.0 | 130.0 | 185.0 | 210.0 | 220.0 | 335.0 | 375.0 | 375.0 | 5.0 | | | |

When the adjuvants were used, they were added in amounts of between 0.025 and 0.1 wt %. The examples included below used N-(2-aminoethyl-3-aminopropyl) trimethoxysilane, 3-glycidoxypropyl trimethoxysilane, and combinations thereof, which were added to the base resin in amounts of 0.025, 0.25 and 0.1 wt %.

The formed strand-cut pellets containing the blended polymer, hydroxyl-containing crosslinking agent and adjuvant, if used, were dried and compression molded into plaques. Specimens were then punched out of the plaques and used for conducting tensile measurements. These specimens or "bars" were then index marked, weighted (if so noted) and placed into an oven. Periodically, the oven was cooled, samples were removed and the "permanent" amount of elongation was measured. The samples were then placed back into the oven for additional exposure time, and the temperature was increased as noted.

EXAMPLES

Comparative Example A and Example 1

Figure 1:
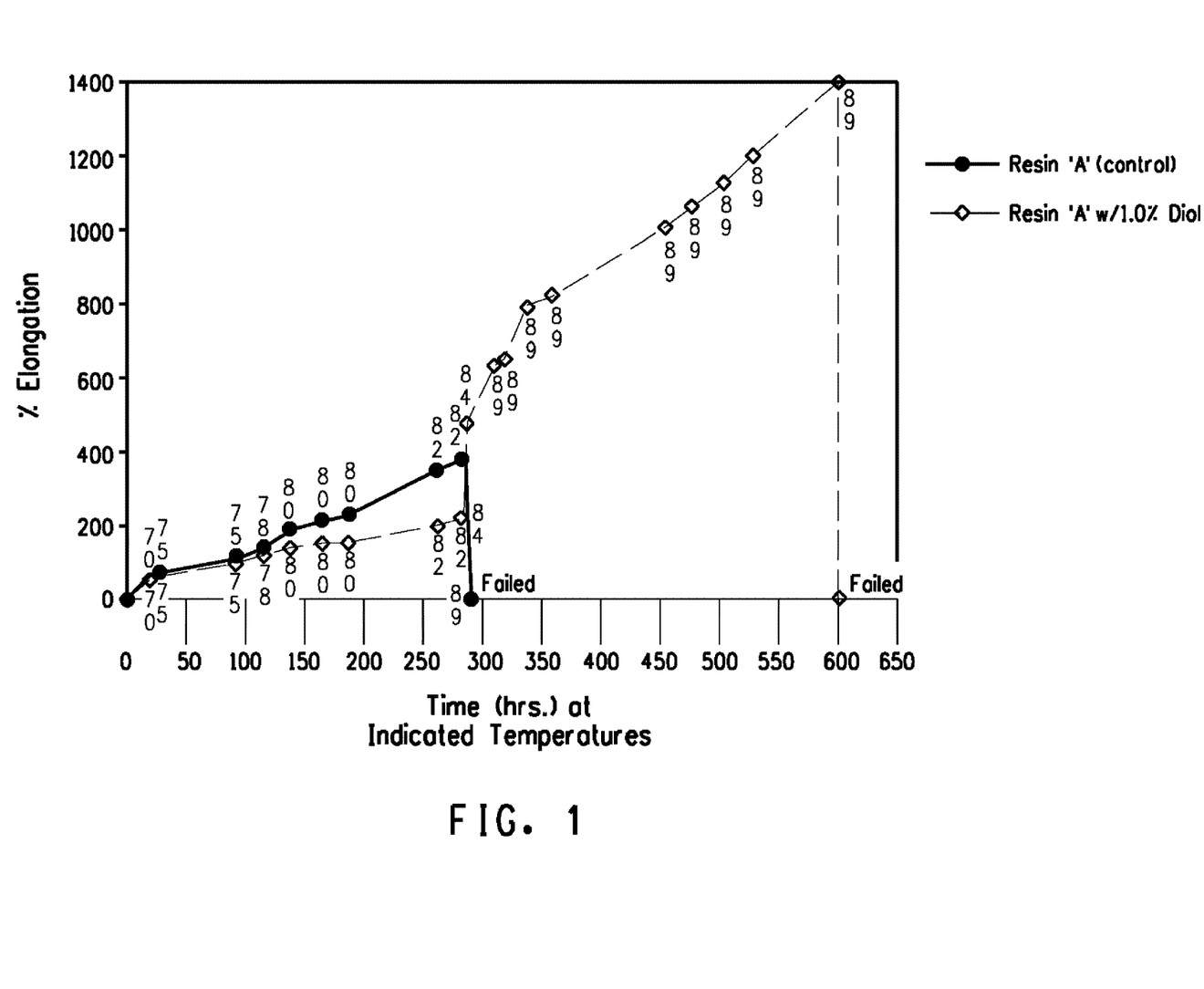
FIG. 1 is a graphical representation of the tensile elongation of a polymer composition of the invention compared to that of a control material.

As described above, polymers were obtained, prepared and extruded to produce test specimens in the form of tensile strips. The tensile creep was measured according to ASTM D2990-09. The strips were then hung in an oven with a weight (82 g) attached to the bottom. As shown in Table 1 and FIG. 1, the tensile strip of Comparative Example A made of Resin A (control) achieved an elongation of less than 400% before mechanical integrity was lost. The strip of Comparative Example B and Examples 2-7

As described above, additives were added to Resin A (Comparative Example B) in the weight percent amounts indicated below in Table 2, and dog-bone plaques were formed. These plaques were die-cut using a punch and conformed to ASTM D638-10, Type V.

Figure 4:
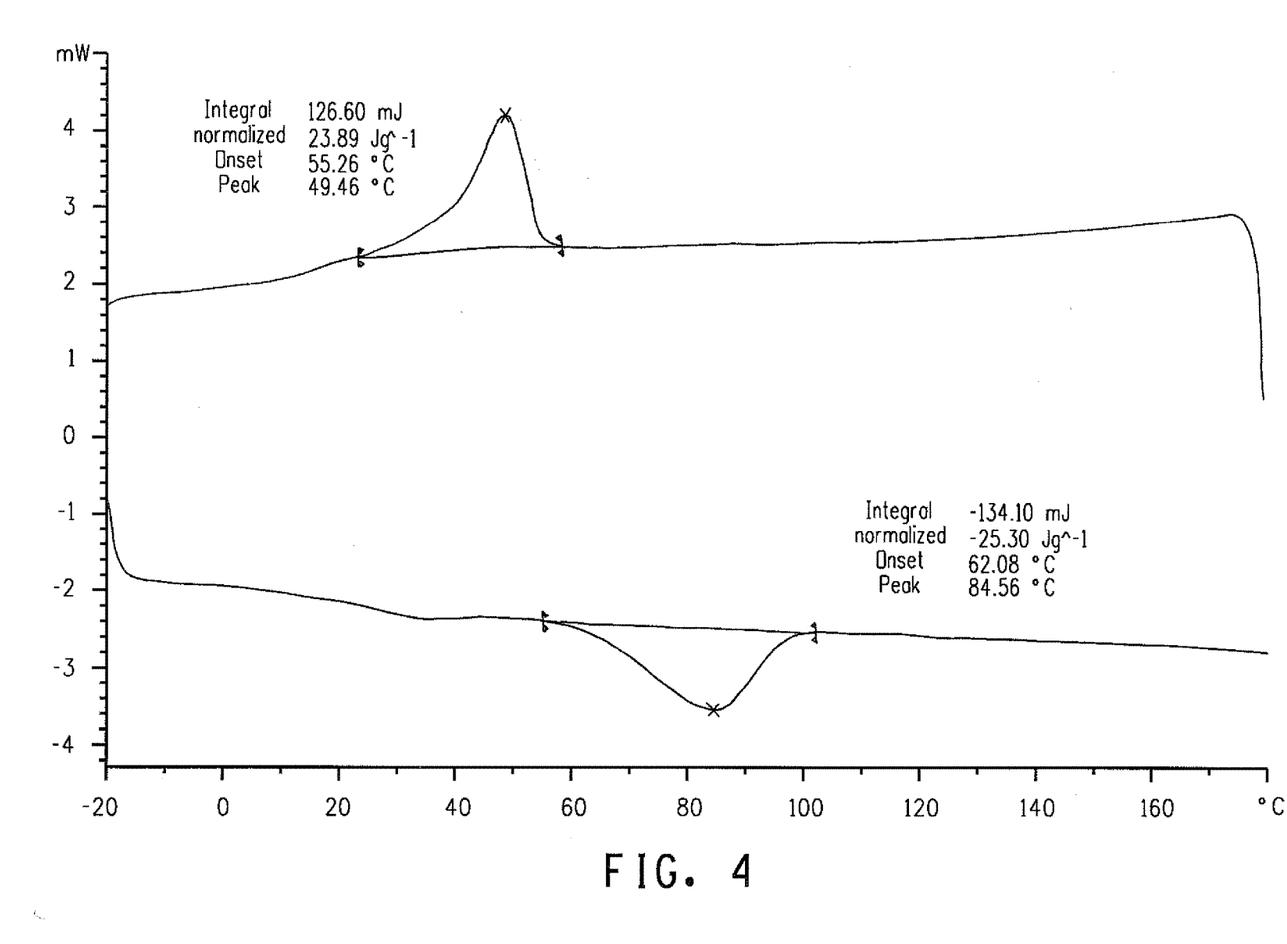
FIG. 4 is a differential scanning calorimetry (DSC) trace of a polymer composition of the invention.

The tensile creep was measured according to ASTM D2990-09. Two indelible ink marks 10 mm apart were put onto each plaque. The plaques were then suspended in an oven at the temperatures indicated in Table 3, below, and heated for the times indicated. No weight was applied to the bottom of the plaques. Table 3 shows the amount of elongation measured for each sample. These data show that the addition of 1,4-butanediol, N-(2-aminoethyl-3-aminopropyl)trimethoxysilane, and 3-glycidoxypropyl trimethoxysilane positively enhanced the tensile creep properties of the control Resin A (C.E. B). This is also shown in FIG. 4.

TABLE 2

| | Resin Additives Compounded into Resin, weight percent | | |
|---|---|---|---|
| Resin Identification | 1,4-Butanediol | N-(2-aminoethyl-3-aminopropyl) trimethoxysilane | 3-Glycidoxypropyl trimethoxysilane |
| Resin 'A', Comp. Ex. B | 0 | 0 | 0 |
| Resin 'B' | 1 | 0 | 0 |

TABLE 2-continued

| | Resin Additives Compounded into Resin, weight percent | | |
|---|---|---|---|
| Resin Identification | 1,4-Butanediol | N-(2-aminoethyl-3-aminopropyl) trimethoxysilane | 3-Glycidoxypropyl trimethoxysilane |
| Resin 'C' | 0 | 0.025 | 0.025 |
| Resin 'D' | 1 | 0.025 | 0.025 |
| Resin 'E' | 0.05 | 0 | 0.1 |
| Resin 'F' | 0.05 | 0 | 0.25 |
| Resin 'G' | 0.1 | 0 | 0.25 |
| Resin 'H' | 0.25 | 0 | 0 |

TABLE 3

| Test Conditions | | Tensile Creep Index Mark Separation (mm) | | | | | | |
|---|---|---|---|---|---|---|---|---|
| Total Time (hrs.) | Oven Temp (° C.) | Resin 'A' C.E. B | Resin 'B' Ex. 2 | Resin 'C' Ex. 3 | Resin 'D' Ex. 4 | Resin 'E' Ex. 5 | Resin 'F' Ex. 6 | Resin 'G' Ex. 7 |
| 0 | 23 | 10 | 10 | 10 | 10 | 10 | 10 | 10 |
| 18 | 95 | 21.43 | 10.2 | 14.76 | 10 | 13.15 | 12.22 | 11.27 |
| 42 | 95 | 57 | 10.29 | 19.35 | 10 | 15.53 | 12.81 | 11.43 |
| 113 | 95 | Failed* | 10.72 | 36.21 | 10 | 16.67 | 13.2 | 12.28 |
| 138 | 95 | | 10.34 | 45.06 | 10 | 17.4 | 14 | 12.26 |
| 163 | 100 | | 10.56 | Failed* | 10 | 36.76 | 17.48 | 14.43 |
| 186 | 100 | | 10.37 | | 9.76 | Failed* | 27.63 | 17.91 |
| 210 | 100 | | 10.38 | | 9.9 | | 62.29 | 21.9 |
| 282 | 100 | | 10.67 | | 10 | | 192.37 | 28.9 |
| 305 | 100 | | 10.52 | | 9.95 | | Failed* | 29.77 |
| 451 | 100 | | 10.68 | | 9.94 | | | 35.47 |
| 474 | 100 | | 10.89 | | 9.98 | | | 38.75 |
| 499 | 100 | | 10.94 | | 9.85 | | | 37.85 |
| 546 | 100 | | 10.73 | | 9.92 | | | 39.59 |
| 620 | 100 | | 10.51 | | 10.05 | | | 42.1 |

*When the resin sample "failed", it elongated to the point of loss of mechanical integrity, therefore unable to support its own weight..

Comparative Example C and Example 8

Figure 5:
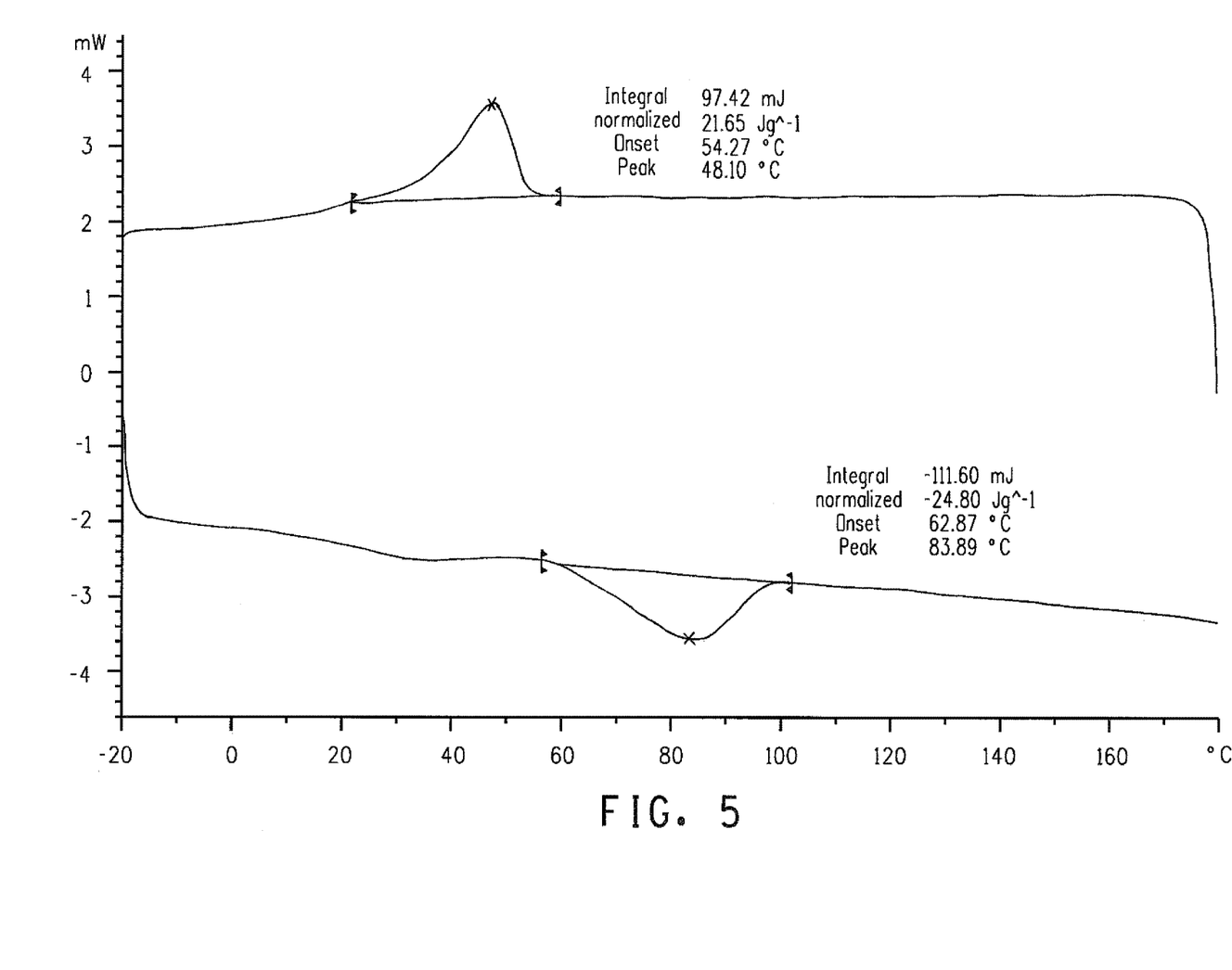
FIG. 5 is a differential scanning calorimetry (DSC) trace of a control material.

The rheology of both the control Resin A (Comparative Example C) and Resin H (Example 8, Resin A +0.25 wt % 1,4-butanediol) were measured. An advanced capillary rheometer (RH7, available from Bohlin Instruments of East Brunswick, NJ) was used to measure melt viscosity at 190° C., 210° C., and 230° C. and at various shear rates as shown in FIG. 5. The data show that there was only a modest change (increase) in melt viscosity at these shear rates and temperatures. Therefore, cross-linked compositions are expected to be readily and easily processible by conventional melt processing methods (e.g., extrusion, blown-film, injection molding, etc.).

Additionally, die swell was measured for both Comparative Example C and Example 8. The measurement represents how much larger in diameter a strand swells as it came out of the rheometer at a given shear stress/flow rate/temperature. Comparative Example C had a die swell of 41%, and Example 8 had a die swell of 73%, which was an indication that the molecular weight distribution has been broadened and most likely some higher molecular weight material had been created in the latter.

As shown in Table 4, melt draw and tension were measured for both Comparative Example C and Example 8 on a Bohlin Instruments RH7 Advanced Capillary Rheometer at 190° C. and a crosshead speed of 2.26 mm/min. The haul-off die had a diameter of 2 mm, a length of 20 mm, and a 180 degree (flat) entry angle. The following data shows the maximum haul-off speed (M/min) and haul-off force (N) at maximum haul-off speed for Comparative Example C and Example 8:

TABLE 4

| Resin | Max Haul-off Speed (M/min) | Haul-off Force (N) |
|---|---|---|
| Comp. Ex. C | 300 | 0.07 |
| Comp. Ex. C | 281 | 0.07 |
| Comp. Ex. C | 247 | 0.06 |
| Comp. Ex. C | 179 | 0.07 |
| Comp. Ex. C | 243 | 0.07 |
| Comp. Ex. C | 243 | 0.07 |
| Comp. Ex. C | 281 | 0.06 |
| Comp. Ex. C | 242 | 0.06 |
| Comp. Ex. C | 282 | 0.06 |
| Comp. Ex. C | 282 | 0.06 |
| Average | 258 | 0.065 |
| Example 8 | <25 | 0.16 |
| Example 8 | <25 | 0.24 |
| Example 8 | <25 | 0.23 |
| Example 8 | <25 | 0.22 |
| Example 8 | <25 | 0.17 |
| Example 8 | <25 | 0.24 |
| Example 8 | <25 | 0.31 |
| Example 8 | <25 | 0.30 |
| Average | <25 | 0.234 |

As can be seen in the data above, the melt tension for Example 8 was much higher than that of the Comparative Example C, although the maximum haul-off speed was reduced. Additionally, the melt tension at 10-25 meters/min for Comparative Example C was about 0.06 Newtons, and thus was fairly independent of draw speed. Also, the melt tension of Comparative Example C was much lower than the melt tension of Example 8, which was measured at 0.234 Newtons.

In summary, these Examples demonstrate that the cross-linking system described herein modifies the rheology, including the creep properties, of the acid copolymer resins and of their ionomers. The extrusion melt pressure and extruder torque necessary to process these compositions were not substantially affected by the crosslinking, however.

While certain of the preferred embodiments of this invention have been described and specifically exemplified above, it is not intended that the invention be limited to such embodiments. Various modifications may be made without departing from the scope and spirit of the invention, as set forth in the following claims.

What is claimed is:

1. A safety laminate comprising at least one interlayer sheet that is laminated to one or more rigid sheets, one or more other polymeric interlayer sheets, or one or more film layers; said at least one interlayer sheet comprising a product of cross-linking an acid copolymer composition; said acid copolymer composition comprising an ethylene copolymer, and said ethylene copolymer comprising copolymerized units of ethylene, about 5 to about 90 wt % of copolymerized units of a first α,β-unsaturated carboxylic acid having 3 to 10 carbon atoms; and optionally about 2 to about 40 wt % of copolymerized units of a derivative of a second α,β-unsaturated carboxylic acid having 3 to 10 carbon atoms; wherein the weight percentages of the copolymerized units are based on the total weight of the ethylene copolymer and the sum of the weight percentages of the copolymerized units in the ethylene copolymer resin is 100 wt %; and wherein optionally at least a portion of the carboxylic acid groups of the copolymerized units of the α,β-unsaturated carboxylic acid units are neutralized to form carboxylate salts;

from 0.05 wt % to about 2 wt % of a hydroxyl-containing crosslinking agent, based on the total weight of the acid copolymer composition; and a silane adjuvant;

wherein at least a portion of the carboxylic acid groups or carboxylate groups of two or more ethylene copolymers are reacted with at least two of the hydroxyl groups of the hydroxyl-containing crosslinking agent, so that the hydroxyl-containing crosslinking agent forms a cross-link between the two or more ethylene copolymer molecules.

2. The safety laminate of claim 1, wherein the ethylene copolymer has a MFR of about 20 to about 400 g/10 min.

3. The safety laminate of claim 1, wherein the ethylene copolymer comprises about 5 to about 30 wt % of copolymerized units of the first α,β ethylenically unsaturated carboxylic acid.

4. The safety laminate of claim 1, wherein the derivative of the second α,β-unsaturated carboxylic acid is an alkyl (meth)acrylate.

5. The safety laminate of claim 1, wherein the hydroxyl-containing crosslinking agent is a diol.

6. The safety laminate of claim 1, wherein the silane adjuvant is selected from the group consisting of n-(2-aminoethyl-3-aminopropyl) trimethoxysilane; 3-glycidoxy propyl trimethoxysilane; and a combination of n-(2-aminoethyl-3-aminopropyl) trimethoxysilane and 3-glycidoxy propyl trimethoxysilane.

7. The safety laminate of claim 1, wherein the rigid sheet comprises a material having a modulus of about 690 MPa or greater, as determined in accordance with ASTM D638, and wherein the material is selected from the group consisting of glass, metal, ceramic, and polymers.

8. The safety laminate of claim 1, wherein the film layer is a metal film or a polymeric film comprising one or more materials selected from the group consisting of polyesters, polycarbonates, polyolefins, norbornene polymers, polystyrenes, styrene-acrylate copolymers, acrylonitrile-styrene copolymers, polysulfones, polyamides, polyurethanes, acrylic polymers, cellulose acetates, cellophanes, vinyl chloride polymers and fluoropolymers.

9. The safety laminate of claim 1, further comprising one or more other polymeric interlayer sheets, wherein the one or more other polymeric interlayer sheets comprise one or more materials selected from the group consisting of poly(vinyl acetals), poly(vinyl chlorides), polyurethanes, ethylene/vinyl acetate copolymers, acid copolymers, and ionomers.

10. The safety laminate of claim 1, wherein the at least one interlayer sheet comprising the acid copolymer composition is laminated between two glass sheets.

11. The safety laminate of claim 1, wherein the at least one interlayer sheet comprising the acid copolymer composition is laminated between a glass sheet and a polyester film that is coated with an abrasion resistant hardcoat on the surface that is facing away from the interlayer sheet.

12. The safety laminate of claim 11, which comprises n rigid sheet or film layers and (n−1) polymeric interlayer sheets, wherein (a) each of the adjacent pairs of the rigid sheet or film layers is interspaced by one of the polymeric interlayer sheets; (b) at least one of the (n−1) polymeric interlayer sheets comprises the acid copolymer composition, and (c) n is an integer and 2<n<10.

13. The safety laminate of claim 12, which comprises an impact zone that faces to the impact force and an anti-spall zone that is firmly adhered to the impact zone and faces away from the impact force, wherein (A) the impact zone is formed by the n rigid sheets and the (n−1) polymeric interlayer sheets; and (B) the anti-spall zone is formed of an additional polymer sheet and an additional film layer with a first surface of the additional polymer sheet adhered firmly to the impact zone and a second surface of the polymer sheet adhered firmly to the additional polymer film.

14. The safety laminate of claim 13, wherein (A) each of the n rigid sheets are glass sheets; (B) each of the (n−1) polymeric interlayer sheets comprises the acid copolymer composition; (C) the additional polymeric interlayer sheet comprises a poly(vinyl butyral); and (D) the additional polymer film is a poly(ethylene terephthalate) film having a surface that is opposite from the impact zone and a hardcoat adhered to the surface.

15. The safety laminate of claim 5, wherein the diol is selected from the group consisting of 1,4-butanediol, 1,3-propanediol and 1,6-hexanediol.

16. The safety laminate of claim 15, wherein the diol comprises 1,4-butanediol.

* * * * *